(12) United States Patent
Farrnbacher et al.

(10) Patent No.: US 9,806,243 B2
(45) Date of Patent: Oct. 31, 2017

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Joerg Farrnbacher, Regensburg (DE); Simon Schicktanz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/029,696

(22) PCT Filed: Oct. 16, 2014

(86) PCT No.: PCT/EP2014/072224
§ 371 (c)(1),
(2) Date: Apr. 15, 2016

(87) PCT Pub. No.: WO2015/055766
PCT Pub. Date: Apr. 23, 2015

(65) Prior Publication Data
US 2016/0233398 A1    Aug. 11, 2016

(30) Foreign Application Priority Data

Oct. 16, 2013 (DE) .......................... 10 2013 111 409

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/01* (2013.01); *H01L 33/56* (2013.01);
(Continued)

(58) Field of Classification Search
CPC . H01L 51/524; H01L 51/525; H01L 51/5253; H01L 51/5296
(Continued)

(56) References Cited

U.S. PATENT DOCUMENTS

2009/0129724 A1* 5/2009 Carter ................. H01L 27/3269
385/14
2009/0302760 A1   12/2009 Tchakarov et al.
(Continued)

FOREIGN PATENT DOCUMENTS

DE    102010032834 A1    2/2012
DE    102012109161 A1    5/2014
(Continued)

OTHER PUBLICATIONS

German Search Report based on Application No. 10 2013 111 409.1 (10 Pages) dated Sep. 18, 2014 (Reference Purpose Only).
(Continued)

*Primary Examiner* — Brook Kebede
(74) *Attorney, Agent, or Firm* — Viering, Jentschura & Partner mbB

(57) ABSTRACT

In various embodiments, an optoelectronic component is provided. The optoelectronic component includes a carrier body. An optoelectronic layer structure is formed above the carrier body and has at least one contact region for electrically contacting the optoelectronic layer structure. A covering body is arranged above the optoelectronic layer structure. At least one contact cutout in which at least one part of the contact region is exposed extends through the carrier body and/or the covering body. At least one plug element for electrically contacting the optoelectronic component is arranged at least partly in the contact cutout and tightly closes the contact cutout. A contact medium, via which the plug element is electrically coupled to the contact region, is arranged in the contact cutout.

15 Claims, 4 Drawing Sheets

(51) Int. Cl.
 *H01L 23/00* (2006.01)
 *H01L 33/56* (2010.01)
(52) U.S. Cl.
 CPC .............. *H01L 2251/5361* (2013.01); *H01L 2924/12041* (2013.01); *H01L 2924/12044* (2013.01); *H01L 2933/0066* (2013.01)
(58) Field of Classification Search
 USPC ................................... 257/90–99
 See application file for complete search history.

(56) References Cited

U.S. PATENT DOCUMENTS

| 2011/0156084 A1 | 6/2011 | Choi et al. |
| 2012/0161113 A1* | 6/2012 | Lowenthal ............ H01L 25/048 257/40 |
| 2014/0110865 A1 | 4/2014 | Ng et al. |
| 2015/0236294 A1 | 8/2015 | Schicktanz et al. |

FOREIGN PATENT DOCUMENTS

| WO | 9853644 A1 | 11/1998 |
| WO | 2008012460 A2 | 1/2008 |
| WO | 2011073189 A2 | 6/2011 |
| WO | 2011161608 A1 | 12/2011 |

OTHER PUBLICATIONS

International Search Report based on Application No. PCT/EP2014/072224 (3 Pages and 2 Pages of English Translation) dated Feb. 6, 2015 (Reference Purpose Only).

* cited by examiner

OPTOELECTRONIC COMPONENT AND METHOD FOR PRODUCING AN OPTOELECTRONIC COMPONENT

RELATED APPLICATIONS

The present application is a national stage entry according to 35 U.S.C. §371 of PCT application No.: PCT/EP2014/072224 filed on Oct. 16, 2014, which claims priority from German application No.: 10 2013 111 409.1 filed on Oct. 16, 2013, and is incorporated herein by reference in its entirety.

TECHNICAL FIELD

Various embodiments relate to an optoelectronic component and a method for producing an optoelectronic component.

BACKGROUND

Conventional optoelectronic components, for example OLEDs, are usually constructed from a substrate, optically functional layers, for example organic functional layers, electrode layers, an encapsulation layer, for example a thin-film encapsulation layer, against action of moisture, and a covering body, for example a cover plate. In many cases, a heat sink and/or a heat spreader, for example a metal plate or a metal film, are/is also laminated onto the cover glass. The cover plate serves as mechanical protection and as a further moisture barrier and, like the substrate, generally consists of solid glass. The cover glass is usually laminated onto the substrate over the whole area in the context of the production process. The encapsulation layer is formed between the cover plate and the substrate and generally extends over the entire substrate.

During the production process, a plurality of optoelectronic components are produced in the component assemblage and are subsequently singulated, for example by means of scribing and breaking the substrate and the cover plate. In the component assemblage, the substrate and the cover plate extend in each case integrally over a plurality of optoelectronic components. In the component assemblage, therefore, electrical contacts of the electrode layers are not accessible, which prevents an electrical contacting and thus the possibility for electro-optical characterization early in the process sequence. During scribing and breaking into individual components, the cover glass above the contacts is removed. Afterward, if appropriate, the encapsulation layer on the contacts can be removed by means of laser ablation, for example. It is only after these process steps that the finished processed and in particular singulated optoelectronic component can be electrically contacted and electro-optically characterized.

In this method, electro-optical measurements can only be carried out relatively late in the manufacturing sequence and with increased outlay in the handling of singulated optoelectronic components.

As an alternative thereto, it is known to lead the conductor tracks of all the optoelectronic components to the edge of the component assemblage. For this purpose, however, it is necessary to sacrifice a useful area that can otherwise be used for the individual optoelectronic components, as a result of which the utilization of the substrate and in particular of the substrate surface becomes poorer. Furthermore, this approach necessitates an additional process step for exposing the encapsulation in the edge region of the component assemblage prior to the further processing. Furthermore, on account of different line lengths, different voltages can then occur in the optoelectronic component, as a result of which a homogeneous generation of light is adversely affected during operation.

Moreover, the conventional optoelectronic component, at the contacts, substantially consists of the glass substrate without a protective cover plate and is particularly susceptible there to damage as a result of corner or edge fragmentation. Furthermore, in the conventional optoelectronic component, the lamination adhesive is applied in a structured fashion in order that the contacts can subsequently be exposed simply, which is relatively complex. Furthermore, a metal plate as a heat sink or heat spreader cannot be applied directly to the encapsulation layer, since the metal plate cannot be separated within the component assemblage in order to expose the contacts.

The exposed contacts of the optoelectronic components can be contacted at virtually any desired location by means of spring pins, conductive adhesive, conductor paste, crimps, etc. or by means of ACF (Anisotropic Conductive Film)-bonded printed circuit boards which make available a solderable metallic area for soldering on further contact elements (e.g. pins, eyes, cables, etc.). Usually, the contact elements are not formed in such a way that they inherently have an electrically insulated spacing with respect to lateral outer edges of the optoelectronic component. Therefore, predefined air clearances and creepage paths have to be taken into account owing to various safety standards in the design and contacting of the optoelectronic component.

SUMMARY

In various embodiments, an optoelectronic component is provided which is simply producible and/or simply contactable, which is electrically contactable and/or characterizable early in the production process and/or which is formed robustly and/or safely.

In various embodiments, a method for producing an optoelectronic component is provided which can be carried out simply and/or wherein the optoelectronic component is electrically contactable and/or characterizable early during the method.

In various embodiments, an optoelectronic component is provided. The optoelectronic component includes a carrier body. An optoelectronic layer structure is formed above the carrier body. The optoelectronic layer structure has at least one contact region for electrically contacting the optoelectronic layer structure. A covering body is arranged above the optoelectronic layer structure. The optoelectronic component includes at least one contact cutout which extends through the carrier body and/or the covering body and in which at least one part of the contact region is exposed. At least one plug element is arranged at least partly in the contact cutout, said at least one plug element tightly closing the contact cutout and serving for electrically contacting the optoelectronic component. A contact medium is arranged in the contact cutout, via which contact medium the plug element is electrically coupled to the contact region.

Exposing the contact region or contact regions enables the electrical contacting and an electro-optical characterization of the optoelectronic component while still in the component assemblage and thus early during the production method. Furthermore, the contact regions formed by contact strips, for example, outside the contact cutouts are protected against mechanical damage by the covering body, as a result of which the optoelectronic component is very robust. Furthermore, it is possible to ensure, in a simple manner, legally prescribed standards such as air clearances and creepage paths, for example, with respect to current-carrying layers of the optoelectronic layer structure. An adhesion medium, for example a lamination adhesive, for fixing the covering body can be applied to the corresponding support areally, which contributes to simple production of the optoelectronic component. An electrical contacting of the optoelectronic component through the contact cutouts can be carried out with only little construction on the optoelectronic component.

The contact medium can serve exclusively for electrical contacting or for electrical contacting and mechanical fixing of the plug element. By way of example, the contact medium can be an electrically conductive adhesion medium. The plug element can be in direct physical contact with the contact region or be spaced apart from the latter.

In various embodiments, the optoelectronic layer structure has an encapsulation layer and/or an adhesion medium layer. The contact cutout extends through the encapsulation layer and/or through the adhesion medium layer. The encapsulation layer serves for protecting the optically functional, for example organic, layers, for example against moisture. The adhesion medium layer serves for fixing the covering body, for example. The adhesion medium layer can be applied to the encapsulation layer areally, for example.

In various embodiments, the contact medium is at least partly liquid. The contact medium can be completely or partly liquid only during introduction into the contact cutout or during the method for producing the optoelectronic component or during subsequent storage of the optoelectronic component or during normal operation of the optoelectronic component. In this case, the contact medium is prevented from escaping by the tightly sealing plug element. As an alternative thereto, the contact medium can fully cure in one of the periods mentioned above. The fact that the contact cutout is tightly closed can mean, for example, that the contact cutout is closed in a liquid-tight fashion, in particular relative to the contact medium in a liquid state.

In various embodiments, the contact medium includes or is formed by a conductive adhesive, that is to say an electrically conductive adhesive. The conductive adhesive can cure and/or dry for example during introduction into the contact cutout or during the method for producing the optoelectronic component or during subsequent storage of the optoelectronic component. As an alternative thereto, the contact medium may include or be formed by a conductive paste.

In various embodiments, the contact medium includes an alloy, in particular a first alloy. The first alloy can be liquid. The first alloy is electrically conductive. At least one part of the first alloy can react, for example chemically, for example with metallic materials of the plug element and of the contact region, as a result of which at least one second alloy can be formed which solidifies and thus fixedly connects the plug element to the contact region and thus to the optoelectronic component. The use of the liquid first alloy for electrically and mechanically coupling the plug element to the contact region enables the optoelectronic component to be contacted and produced simply, expediently and/or precisely. As an alternative thereto, it is possible for no chemical reaction of the first alloy to take place and the first alloy can serve only for electrically contacting the plug element.

In various embodiments, the plug element is in direct physical contact with the contact region via a conductor element. The conductor element is a partial element of the plug element. The electrical coupling thus takes place indirectly via the contact medium and additionally directly via the direct physical contact. This can contribute to a particularly good electrical coupling. The plug element can be formed for example mechanically flexibly, for example as a spring element. The plug element can be formed for example in such a way that it flexes mechanically upon being arranged in the contact cutout on account of a counterpressure of the contact region, with the result that it is possible to compensate for component tolerances that possibly occur when the plug element is arranged in the contact cutout, and the gold physical and electrical coupling is ensured.

In various embodiments, the plug element has at least one conductor element via which the electrical coupling to the contact region is formed. The conductor element includes an electrically conductive material. The conductor element may include for example a metallic material, for example a metal or a semimetal, and/or plastic, wherein the plastic can be formed in an electrically conductive fashion. By way of example, the conductor element includes copper, silver or gold. The conductor element can be for example a wire or a pin.

In various embodiments, the plug element has a plug body. A sealant is arranged between the plug body and the covering body, said sealant contributing to the fact that the contact cutout is tightly closed by means of the plug element. The sealant can be formed as a sealant layer and/or be formed for example by a liquid, for example an adhesive or a paste, or by a solid, for example a rubber seal. The plug body can be a molded body, for example. The plug body can be produced in a press molding method or a compression molding method, for example. The plug body may include or be formed from an electrically insulating plastic, for example. The conductor element can be partly embedded into the plug body and thus be physically connected thereto.

In various embodiments, the sealant has an adhesive effect. The plug body is fixed, for example cohesively, to the covering body by means of the sealant. By way of example, the sealant layer may include an adhesive and/or an adhesive tape, for example a double-sided adhesive tape.

In various embodiments, the optoelectronic component includes at least two contact cutouts. The plug element has at least two conductor elements. Respectively one of the conductor elements is arranged in the contact cutouts. The conductor elements can be mechanically coupled to one another via the plug body, for example. For example, the conductor elements can be at least partly embedded into the plug body. In addition to the two conductor elements, three or more further conductor elements can be fixed on or in the plug body, for example by means of MID technology. Furthermore, a polarity-reversal protection can be formed by means of the plug body and/or the arrangement of the conductor elements. The polarity-reversal protection can be formed for example by the conductor elements and the contact cutouts being arranged relative to one another such that the conductor elements can be arranged in the contact cutouts exclusively in one way.

In various embodiments, the plug element has at least one holding element by means of which the optoelectronic component can be mechanically fixed. The holding element can be an eye or a hook, for example. The holding element can be arranged on the plug body or formed of the latter, for example. The optoelectronic component can be fixed to a mounting body, for example, by means of the holding element. The mounting body can be a luminaire, a wall or a ceiling of a room, for example.

In various embodiments, a method for producing an optoelectronic component, for example the optoelectronic component explained above, is provided. In the method, the carrier body is provided. The optoelectronic layer structure having at least the contact region for electrically contacting the optoelectronic layer structure is formed above the carrier body. The covering body is arranged above the optoelectronic layer structure. Before or after arranging the covering body, the at least one contact cutout is formed in the carrier body and/or the covering body such that it extends through the carrier body and/or the covering body and that at least part of the contact region is exposed in it. The contact medium is arranged in the contact cutout. For electrically contacting the optoelectronic component, at least the plug element is arranged at least partly in the contact cutout in such a way that it tightly closes the contact cutout and that it is electrically coupled to the contact region via the contact medium.

In various embodiments, before arranging the plug element in the contact cutout, the sealant layer is arranged on the plug element and/or on the covering body.

In various embodiments, the plug element is fixed to the covering body with the aid of the sealant layer.

In various embodiments, the contact medium is introduced into the contact cutout in a liquid state.

BRIEF DESCRIPTION OF THE DRAWINGS

The invention is explained in greater detail below on the basis of an exemplary embodiment, wherein also as before no distinction will be drawn specifically among the claim categories and the features in the context of the independent claims are intended also to be disclosed in other combinations. In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

DETAILED DESCRIPTION

Figure 1:
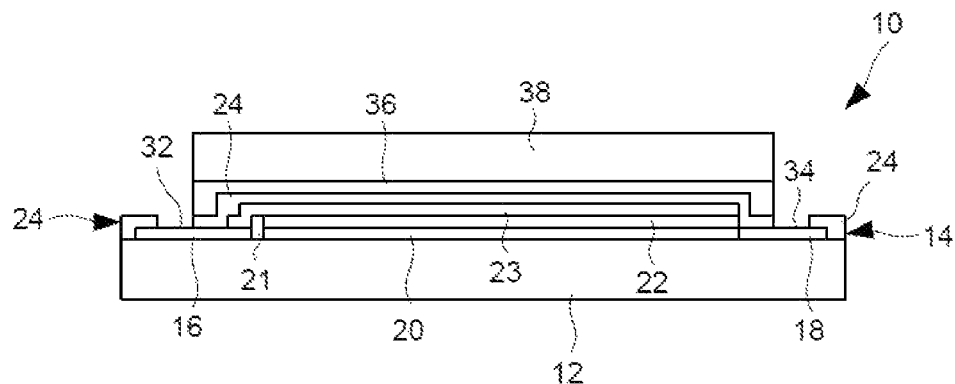
FIG. 1 shows a sectional illustration of a conventional optoelectronic component.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

The connection of a first body to a second body can be positively locking, force locking and/or cohesive. The connections can be embodied as releasable, i.e. reversible. In various configurations, a reversible, close connection can be realized for example as a screw connection, a hook and loop fastener, a clamping, a latching connection and/or by means of a use of clips. However, the connections can also be embodied as non-releasable, i.e. irreversible. In this case, a non-releasable connection can be separated only by means of the connection means being destroyed. In various configurations, an irreversible, close connection can be realized for example as a riveted connection, an adhesively bonded connection or a soldered connection.

In the case of a positively locking connection, the movement of the first body can be restricted by a surface of the second body, wherein the first body moves perpendicularly, i.e. normally, in the direction of the restricting surface of the second body. In other words, in the case of a positively locking connection, a relative movement of the two bodies is prevented in at least one direction on account of their mutually corresponding shapes. A hook in an eye can be restricted in movement for example in at least one spatial direction. In various configurations, a positively locking connection can be realized for example as a screw connection, a hook and loop fastener, a clamping, a latching connection and/or by means of clips.

In the case of a force-locking connection, on account of a physical contact of the two bodies under pressure, a static friction can restrict a movement of the first body parallel to the second body. One example of a force-locking connection may be, for example, a bottle cork in a bottle neck or a dowel with an interference fit in a corresponding dowel hole. The force-locking connection can also be designed as a press fit.

In the case of a cohesive connection, the first body can be connected to the second body by means of atomic and/or molecular forces. Cohesive connections can often be non-releasable connections. In various configurations, a cohesive connection can be realized for example as an adhesively bonded connection, a soldered connection, for example of a glass solder, or of a metal solder, or as a welded connection.

In various embodiments, the term "translucent" or "translucent layer" can be understood to mean that a layer is transmissive to electromagnetic radiation, for example to the radiation emitted by an electromagnetic radiation emitting component, for example in one or a plurality of wavelength ranges, for example to light in a wavelength range of visible light (for example at least in one partial range of the wavelength range of 380 nm to 780 nm). By way of example, in various embodiments, the term "translucent layer" should be understood to mean that substantially the entire quantity of radiation coupled into a structure (for example a layer) is also coupled out from the structure (for example layer), wherein part of the light can be scattered in this case.

In various embodiments, an optoelectronic component can be an organic optoelectronic component, that is to say may include at least one organic optically functional layer. In various embodiments, an optoelectronic component can be an electromagnetic radiation emitting component or an electromagnetic radiation absorbing component. An electromagnetic radiation absorbing component can be for example a solar cell. In various embodiments, an electromagnetic radiation emitting component can be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be light in the visible range, UV light and/or infrared light, for example. In this connection, the electromagnetic radiation emitting component can be formed for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

FIG. 1 shows a conventional optoelectronic component 1. The conventional optoelectronic component 1 includes a carrier 12, for example a substrate. An optoelectronic layer structure is formed on the carrier 12. The carrier 12 can be formed as translucent or transparent.

The optoelectronic layer structure includes a first electrode layer 14 including a first contact section 16, a second contact section 18 and a first electrode 20. The first contact section 16 can also be designated as a first contact strip and the second contact section 18 can also be designated as a second contact strip. The second contact section 18 is electrically coupled to the first electrode 20 of the optoelectronic layer structure. The first electrode 20 is electrically insulated from the first contact section 16 by means of an electrical insulation barrier 21. An optically functional layer structure 22, for example an organic functional layer structure, of the optoelectronic layer structure is formed above the first electrode 20. The optically functional layer structure 22 may include for example one, two or more partial layers, as explained in greater detail further below with reference to FIG. 15. A second electrode 23 of the optoelectronic layer structure is formed above the organic functional layer structure 22, said second electrode being electrically coupled to the first contact section 16. The first electrode 20 serves for example as an anode or cathode of the optoelectronic layer structure. In a manner corresponding to the first electrode, the second electrode 23 serves as a cathode or anode of the optoelectronic layer structure.

An encapsulation layer 24 of the optoelectronic layer structure is formed above the second electrode 23 and partly above the first contact section 16 and partly above the second contact section 18, said encapsulation layer encapsulating the optoelectronic layer structure. In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

An adhesion medium layer 36 is formed above the encapsulation layer 24. The adhesion medium layer 36 includes for example an adhesion medium, for example an adhesive, for example a lamination adhesive, a lacquer and/or a resin. A covering body 38 is formed above the adhesion medium layer 36. The adhesion medium layer 36 serves for fixing the covering body 38 to the encapsulation layer 24. The covering body 38 includes glass, metal and/or graphite, for example. For example, the covering body 38 can be formed substantially from glass and include a thin metal layer, for example a metal film, and/or a graphite layer, for example a graphite laminate, on the glass body. If appropriate, a protective layer for protecting the graphite layer can be formed above the graphite layer. The covering body 38 serves for protecting the conventional optoelectronic component 1, for example against mechanical force actions from outside. Furthermore, the covering body 38 can serve for spreading and/or dissipating heat generated in the conventional optoelectronic component 1. By way of example, the glass of the covering body 38 can serve as protection against external actions and the metal layer of the covering body 38 can serve for spreading and/or dissipating the heat that arises during the operation of the conventional optoelectronic component 1.

The adhesion medium layer 36 can be applied to the encapsulation layer 24 in a structured fashion, for example. The fact that the adhesion medium layer 36 is applied to the encapsulation layer 24 in a structured fashion can mean, for example, that the adhesion medium layer 36 already has a predefined structure directly upon application. By way of example, the adhesion medium layer 36 can be applied in a structured fashion by means of a dispensing or printing method.

The conventional optoelectronic component 1 is sensitive to external actions in the first contact region 32 and the second contact region 34, since no covering body 38 is provided in these contact regions 32, 34.

The conventional optoelectronic component 1 can be singulated from a component assemblage, for example, by the carrier 12 being scribed and then broken along its outer edges illustrated laterally in FIG. 1, and by the covering body 38 equally being scribed and then broken along its lateral outer edges illustrated in FIG. 1. The encapsulation layer 24 above the contact regions 32, 34 is exposed during this scribing and breaking. Afterward, the first contact region 32 and the second contact region 34 can be exposed in a further method step, for example by means of an ablation process, for example by means of laser ablation, mechanical scratching or an etching method.

Figure 2:
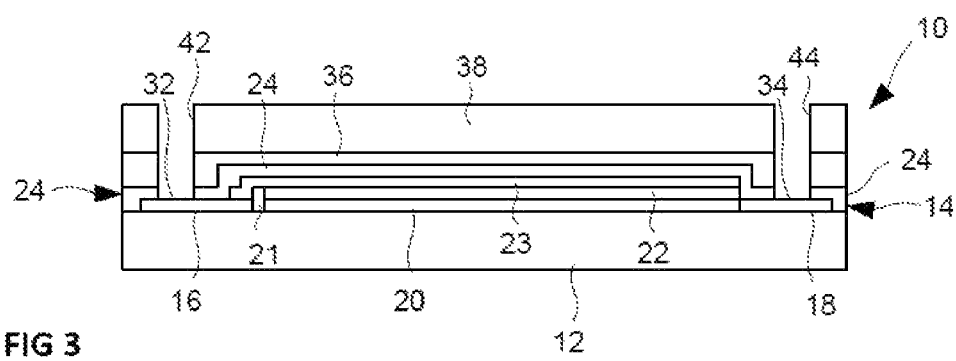
FIG. 2 shows a sectional illustration of one embodiment of an optoelectronic component in a first state.

FIG. 2 shows a sectional illustration of one embodiment of an optoelectronic component 10 in a first state. In the first state, the optoelectronic component is not yet completed. The optoelectronic component can for example largely correspond to the conventional optoelectronic component 1 explained above. In contrast thereto, however, the embodiment of the optoelectronic component 10 as shown in FIG. 2 includes an adhesion medium layer 36 and a covering body 38, which extend as far as the lateral outer edges of the carrier body 12 as shown in FIG. 2. Moreover, the optoelectronic component 10 includes a first contact cutout 42 and a second contact cutout 44, which extend through the covering body 38 and the adhesion medium layer 36 as far as the first contact electrode 16 and the second contact electrode 18, such that the first contact region 32 is exposed in the first contact cutout 42 and the second contact region 34 is exposed in the second contact cutout 44. The contact cutouts 42, 44 can be formed, with respect to their cross section perpendicular to an elongate axis of the contact cutouts 42, 44, such that they are for example rectangular, for example square, and/or arbitrarily polygonal and/or roundish, for example oval or circular.

Optionally, the covering body 38 can be formed substantially or completely from metal. As an alternative thereto, however, the covering body 38 can also be formed in the manner as explained above.

During singulation from the component assemblage, the optoelectronic component 10 can be cut and/or sawn and/or scribed and broken simply along the common, flush lateral outer edges of the covering body 38 and of the carrier body 12. Alternatively, it is possible for the outer edges of the covering body 38 and of the carrier body 12 not to be formed flush with one another, and to be cut and/or sawn independently of one another.

The embodiment of the optoelectronic component 10 as shown in FIG. 2 is formed particularly robustly, in particular with respect to external mechanical actions, since both the covering body 38 and the adhesion medium layer 36 extend as far as the outer edge of the carrier body 12 and, consequently, the optoelectronic component 10 is also formed very stably in the contact regions 32, 34.

Figure 3:
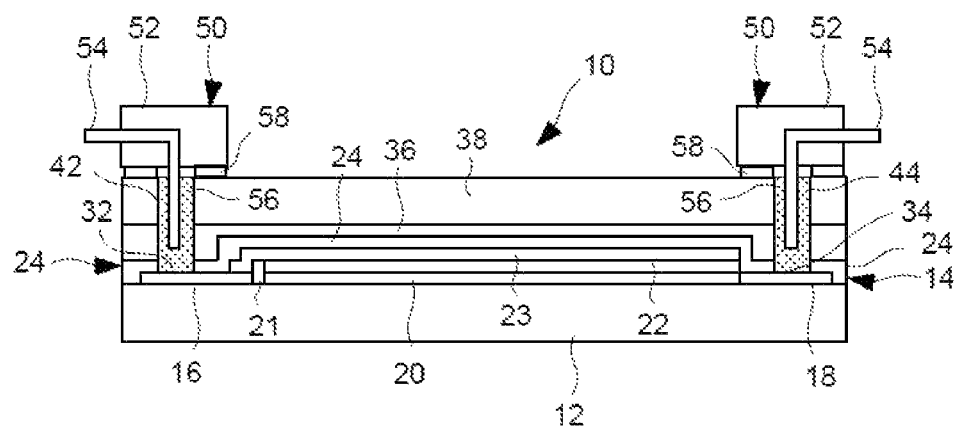
FIG. 3 shows a sectional illustration of one embodiment of the optoelectronic component in accordance with FIG. 2 in a second state.

FIG. 3 shows the optoelectronic component 10 in accordance with FIG. 2 in a second state with an electrical contacting. The electrical contacting is realized by means of at least one, for example two or more plug elements 50 of the optoelectronic component. The plug elements 50 each have a plug body 52 and a conductor element 54. The plug elements 50 close the contact cutouts 42, 44 tightly, in particular liquid-tightly. The plug bodies 52 can be formed in an electrically insulating fashion, for example. For example, the plug bodies 52 are formed by an electrically insulating material, for example by a plastic and/or a ceramic. The plug bodies 52 can be formed by a plastic injection-molded part, for example. The sealing effect of the plug elements 50 can be performed by the plug bodies 52, for example.

The conductor elements 54 can also be designated as contact elements and are formed in an electrically conductive fashion. By way of example, the conductor elements 54 are formed by an electrically conductive material or at least include the latter. By way of example, the conductor elements 54 include a metal, for example copper, silver and/or gold.

The conductor elements 54 can be embodied for example in the form of pegs, pins, springs, clips or lugs. The plug elements 50 are arranged in the contact cutouts 42, 44 in such a way that the conductor elements 54 project at least partly into the corresponding contact cutouts 42, 44. In this embodiment, the conductor elements 54 are spaced apart from the contact regions 32, 34. As an alternative thereto, the conductor elements 54 can touch the contact regions 32, 34. At their ends remote from the contact regions 32, 34, the conductor elements 54 can project laterally from the plug bodies 52 and can be further contacted or continued there.

A contact medium 56 is arranged in the contact cutouts 42, 44. In this embodiment, the electrical coupling between the conductor elements 54 and the contact regions 32, 34 is formed exclusively by means of the contact medium 56. The contact medium 56 may include or be for example a conductive liquid, for example an alloy, a conductive adhesive or a conductive paste. The conductor elements 54 are dipped into the contact medium 56 and thus obtain contact with the contact regions 32, 34. The contact medium 56 can remain permanently liquid, or remain at least partly liquid and partly cure or dry, or fully cure or dry. The contact medium 56 can be formed in such a way that the partial or full curing or drying is concluded during the method for producing the optoelectronic component 10, during a subsequent period of storage of the optoelectronic component 10 or subsequently during normal operation of the optoelectronic component 10.

The cured or dried contact medium 56 can connect, for example cohesively, the conductor elements 54 and thus the plug elements 50 fixedly to the contact regions 32, 34 and thus fixedly to the contact sections 16, 18.

The liquid contact medium 56 is prevented from escaping from the contact cutouts 42, 44 by the tightly sealing plug elements 50, in particular the plug bodies 52. In this context, the plug bodies 52 can also be designated as covers. The plug bodies 52 can optionally be coupled to the covering body 38 by means of a sealant 58. The sealant 58 is arranged between the plug bodies 52 and the covering body 38. The sealant 58 can be liquid, viscous or solid, for example. The sealant 58 may include for example an adhesive, for example an adhesive tape, a paste or a rubber element, for example a rubber ring. The sealant 58 can connect the plug bodies 52 to the covering body 38 cohesively, for example. The conductor elements 54 are led through the plug bodies 52 and form the possibility of connection to further peripheral units (not illustrated). Furthermore, the conductor elements 54, as a result of the predefined hole spacing with respect to the lateral outer edge of the optoelectronic component, have a predefined electrically insulating spacing with respect to the lateral outer edge, which is helpful in the standard-conforming design of luminaires.

If a liquid alloy, for example a first alloy, is used as contact medium 56, then the first alloy can enter into a chemical reaction with the metallic materials of the conductor elements 54 and the contact regions 32, 34 and form a second alloy, which undergoes transition to a solid state of aggregation and not only electrically couples the conductor elements 54 and the contact regions 32, 34 to one another, but also fixedly connects them to one another, for example cohesively. For this purpose, the first alloy can have a melting point that is lower than the melting point of the second alloy. The low melting point of the first alloy is for example below a temperature starting from which materials of the optically functional layer structure 20, for example of organic layers, are damaged. This enables particularly gentle production of the optoelectronic component 10, as a result of which the lifetime and the storage stability can in turn be increased. The melting point of the first alloy can be chosen, in particular, such that the first alloy is liquid under all operating and storage conditions, and the melting point of the second alloy can be chosen such that the second alloy is solid under all operating and storage conditions. The coupling of the plug elements 50 to the contact regions 32, 34 with the aid of the liquid first alloy can take place at a temperature at which the first alloy is liquid and the second alloy is not liquid. By way of example, the first alloy can be liquid at room temperature. This enables the optoelectronic component 10 to be produced particularly expediently and simply. In particular, temperature regulation of the component parts of the optoelectronic component 10 is not necessary with the use of the first alloy. In particular, processing under ambient air in a clean room is possible. Upon contact with the metallic materials of the contact regions 32, 34 and of the plug elements 54, the second alloy can then form from the metals of the first alloy and the metallic materials of the conductor elements 54 and of the contact sections 16, 18. Said second alloy undergoes transition to its solid state of aggregation on account of the currently prevailing temperature and solidifies. The first alloy can react completely or only partly to form the second alloy. In this case, the plug elements 50 and the contact regions 32, 34, for example the contact sections 16, 18 having the contact regions 32, 34, are connected to one another.

The first alloy may include for example gallium, indium, tin, copper, molybdenum, silver and/or bismuth. By way of example, the first alloy may include GaInSn or InBiSn. The first and/or second metallic material may include for example aluminum, zinc, chromium, copper, molybdenum, silver, gold, nickel, gallium, indium and/or tin. Correspondingly, the second alloy or the further alloy may include for example aluminum, tin, magnesium, silver, copper, silver, gold, molybdenum or zinc.

Figure 4:
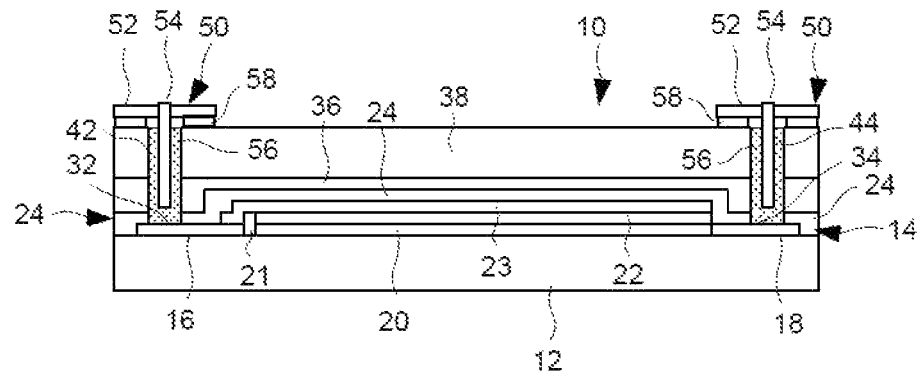
FIG. 4 shows a sectional illustration of one embodiment of the optoelectronic component in accordance with FIG. 2 in a second state.

FIG. 4 shows a sectional illustration of the embodiment of the optoelectronic component 10 in accordance with FIG. 2 in the second state, that is to say with the electrical contacting. This embodiment can largely correspond to one of the configurations of the optoelectronic components 10 explained above. The plug bodies 52 are formed in a plate-shaped fashion. The conductor elements 54 extend rectilinearly through the plug bodies 52.

Figure 5:
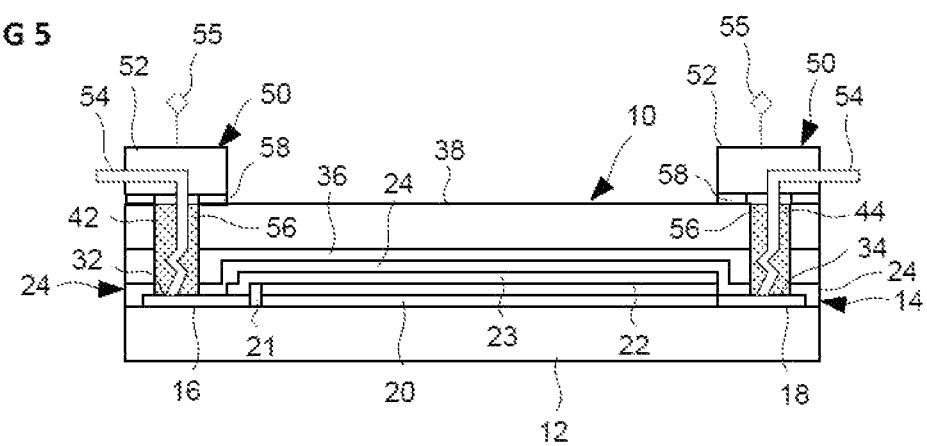
FIG. 5 shows a sectional illustration of one embodiment of the optoelectronic component in accordance with FIG. 2 in a second state.

FIG. 5 shows a sectional illustration of the embodiment of the optoelectronic component 10 in accordance with FIG. 2 in the second state, that is to say with the electrical contacting. This embodiment can largely correspond to one of the configurations of the optoelectronic components 10 explained above. The conductor elements 54 are in direct physical contact with the contact regions 32, 34. The electrical contacting is thus effected via the direct physical contact and via the contact medium 56. The conductor elements 54 are formed mechanically flexibly, for example as spring elements. By way of example, the conductor elements 54 are formed in such a way that they are compressed and flex mechanically in an axial direction of the contact cutouts 42, 44 when the plug elements 50 are arranged in the contact cutouts 42, 44. This brings about a compressive force that acts between the conductor elements 54 and the contact regions 32, 34. This compressive force can contribute to a particularly good electrical coupling of the conductor elements 54 to the contact regions 32, 34.

In all the embodiments, holding elements 55 can optionally be arranged on the plug elements 50. By way of example, the holding elements 55 can be arranged on the plug bodies 52 or the plug bodies 52 can form the holding elements 55. In other words, the holding elements 55 and the plug bodies 52 can be formed in a multipartite fashion or in an integral fashion. The holding elements 55 can serve for example for the positively locking fixing of the optoelectronic component 10 to a mounting device (not illustrated). The holding elements 55 may include eyes, hooks or latching hooks, for example. The conductor elements 54 and/or the holding elements 55 can be adapted to already existing mechanical and/or electrical interface geometries.

Figure 6:
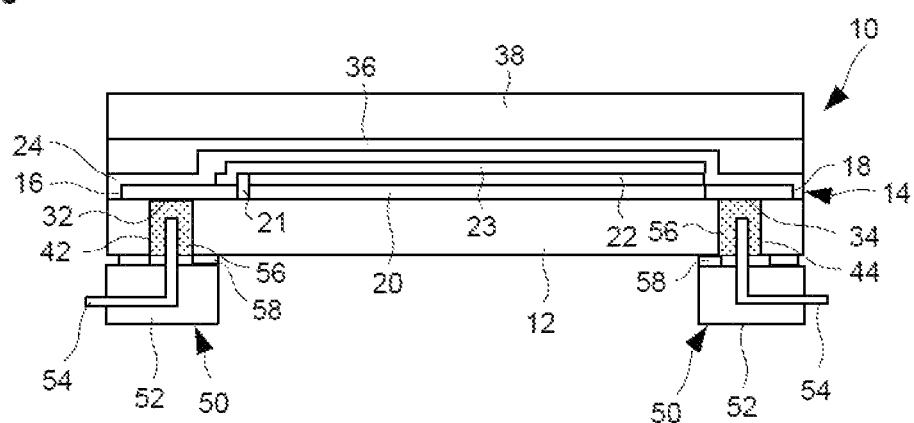
FIG. 6 shows a sectional illustration of one embodiment of an optoelectronic component.

FIG. 6 shows a sectional illustration of the embodiment of the optoelectronic component 10 in accordance with FIG. 2 in the second state, that is to say with the electrical contacting. This embodiment can largely correspond to one of the configurations of the optoelectronic components 10 explained above. In this case, the adhesion medium layer 36 and the covering body 38 are formed without the contact cutouts 42, 44 and are arranged above the encapsulation layer 24. The first contact cutout 42 and the second contact cutout 44 are formed in the carrier body 12. The contact cutouts 42, 44 in the carrier body 12 can be formed for example by means of laser drilling, mechanical drilling or wet-chemical etching. The contact cutouts 42, 44 of the carrier body 12 extend as far as the contact sections 16, 18. The contact regions 32, 34 are exposed in the contact cutouts 42, 44.

Figure 7:
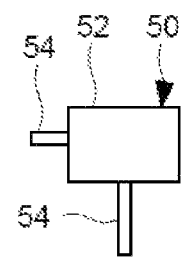
FIG. 7 shows a first side view of one embodiment of a plug element.

FIG. 7 shows a side view of one embodiment of a plug element 50 that can for example largely correspond to one of the plug elements 50 explained above. The plug element 50 can be arranged in one of the contact cutouts 32, 34 and serves for electrically contacting the first or second contact section 16, 18, in particular the first or second contact region 32, 34. The plug element 50 has at least one, for example two or more conductor elements 54, of which in FIG. 7 one is shown and possible further conductor elements are concealed. The conductor elements 54 are at least partly embedded into the plug body 52.

Figure 8:
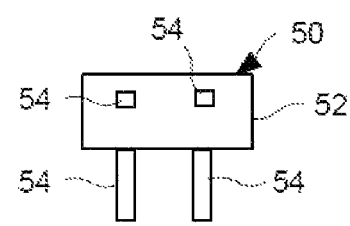
FIG. 8 shows a second side view of the plug element in accordance with FIG. 7.

FIG. 8 shows a further side view of the plug element 50 in accordance with FIG. 7. By way of example, two conductor elements 54 of the plug element 50 are shown in FIG. 8.

Figure 9:
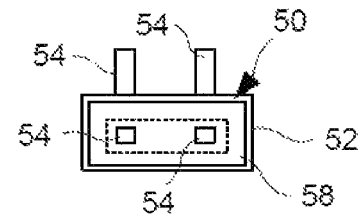
FIG. 9 shows a bottom view of the plug element in accordance with FIG. 7.

FIG. 9 shows a bottom view of the plug element 50 in accordance with FIG. 7. The sealant 58 is arranged on the underside of the plug body 52. With the plug element 50 arranged properly, the sealant 58 prevents the contact medium 56 from flowing out of the contact cutouts 42, 44. Furthermore, the sealant 58 can have an adhesive effect and contribute to fixing the plug element 50 to the covering body 38. By way of example, the sealant may include an adhesive tape, for example a double-sided adhesive tape, or a liquid or two-component adhesive that cures. Apart from the conductor elements 54, the sealant 58 can completely or at least substantially cover the underside or be formed in a frame-shaped fashion around the conductor elements 54, this last being illustrated by the dashed line in FIG. 9.

Figure 10:
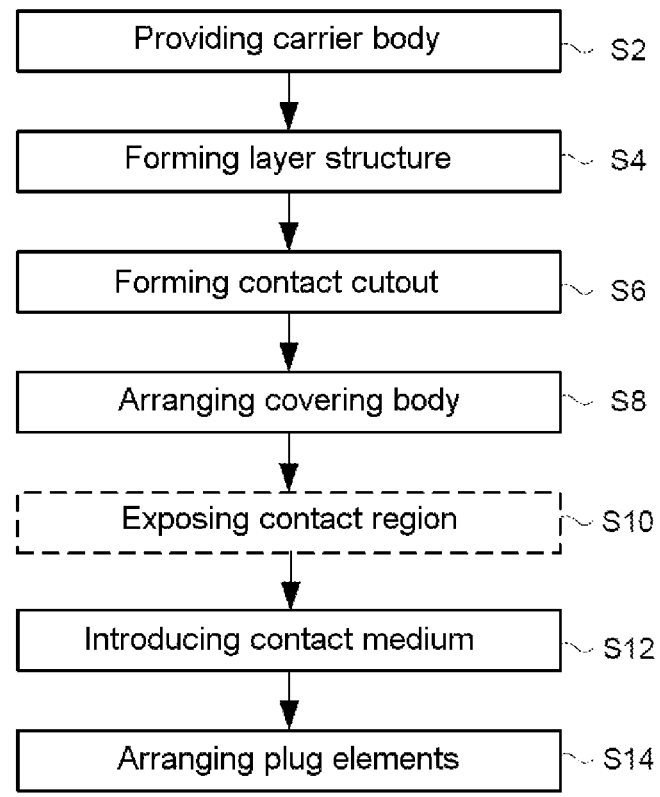
FIG. 10 shows a flow diagram of one embodiment of a method for producing the optoelectronic component.

FIG. 10 shows a flow diagram of one embodiment of a method for producing an optoelectronic component 10, for example one of the optoelectronic components 10 explained above.

A Step S2 Involves Providing the Carrier Body 12.

A step S4 involves forming the optoelectronic layer structure, in particular the first electrode 14, the optically functional layer structure 22, the second electrode 23 and the encapsulation layer 24.

A step S6 involves forming the contact cutouts 42, 44 in the covering body 38, for example by means of laser drilling, mechanical drilling or by means of an etching method, for example a physical and/or chemical etching method. As an alternative thereto, the contact cutouts 42, 44 can also be formed in the carrier body 12.

A step S8 involves arranging the covering body 38 above the layer structure, for example above the encapsulation layer 24, for example by means of an adhesion medium layer 36, specifically in such a way that, if appropriate, the contact cutouts 42, 44 overlap the contact regions 32, 44.

If necessary, a step S10 can involve exposing the contact regions 32, 34. By way of example, the encapsulation layer 24 and/or the adhesion medium layer 36 above the corresponding contact regions 32, 34 can be removed. This can be carried out for example in an etching method in which the covering body 38 can serve as an etching stop.

A step S12 involves filling the contact medium 56, for example in a liquid state, into the contact cutouts 42, 44.

A step S14 involves arranging the plug elements 50 in such a way that they are arranged at least partly in the contact cutouts 42, 44 and that they tightly close the contact cutouts 42, 44. By way of example, the plug elements 50 are arranged in such a way that the plug bodies 52 adhere to the covering body 38 and seal the contact cutouts 42, 44, for example by means of the sealant 58. Furthermore, by way of example, the plug elements 50 are arranged in such a way that the conductor elements 54 project into the contact cutouts 42, 44 and are dipped into the contact medium 56.

Afterward, the contact medium 56 can be fully or partly cured or dried.

Figure 11:
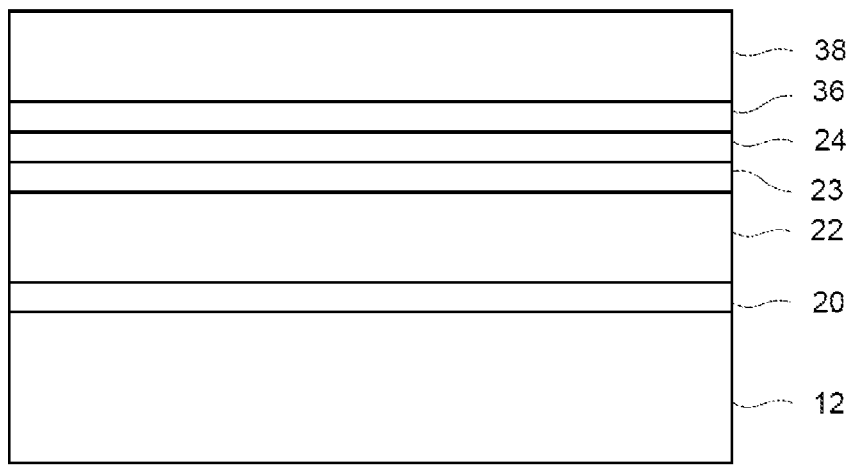
FIG. 11 shows a detailed sectional illustration of one embodiment of a layer structure of an optoelectronic component.

FIG. 11 shows a detailed sectional illustration of a layer structure of one embodiment of an optoelectronic component, for example of the optoelectronic component 10 explained above, wherein the plug elements 50 and the contact regions 32, 34 are not illustrated in this detail view. The optoelectronic component 10 can be formed as a top emitter and/or bottom emitter. If the optoelectronic component 10 is formed as a top emitter and bottom emitter, the optoelectronic component 10 can be referred to as an optically transparent component, for example a transparent organic light emitting diode.

The optoelectronic component 10 includes the carrier 12 and an active region above the carrier 12. A first barrier layer (not illustrated), for example a first barrier thin-film layer, can be formed between the carrier 12 and the active region. The active region includes the first electrode 20, the organic functional layer structure 22 and the second electrode 23. The encapsulation layer 24 is formed above the active region. The encapsulation layer 24 can be formed as a second barrier layer, for example as a second barrier thin-film layer. The cover 38 is arranged above the active region and, if appropriate, above the encapsulation layer 24. The cover 38 can be arranged on the encapsulation layer 24 by means of an adhesion medium layer 36, for example.

The active region is an electrically and/or optically active region. The active region is, for example, that region of the optoelectronic component 10 in which electric current for the operation of the optoelectronic component 10 flows and/or in which electromagnetic radiation is generated or absorbed.

The organic functional layer structure 22 may include one, two or more functional layer structure units and one, two or more intermediate layers between the layer structure units.

The carrier 12 can be formed as translucent or transparent. The carrier 12 serves as a carrier element for electronic elements or layers, for example light emitting elements. The carrier 12 may include or be formed from, for example, glass, quartz, and/or a semiconductor material or any other suitable material. Furthermore, the carrier 12 may include or be formed from a plastics film or a laminate including one or including a plurality of plastics films. The plastic may include one or a plurality of polyolefins. Furthermore, the plastic may include polyvinyl chloride (PVC), polystyrene (PS), polyester and/or polycarbonate (PC), polyethylene terephthalate (PET), polyethersulfone (PES) and/or polyethylene naphthalate (PEN). The carrier 12 may include or be formed from a metal, for example copper, silver, gold, platinum, iron, for example a metal compound, for example steel. The carrier 12 can be formed as a metal film or metal-coated film. The carrier 12 can be a part of a mirror structure or form the latter. The carrier 12 can have a mechanically rigid region and/or a mechanically flexible region or be formed in this way.

The first electrode 20 can be formed as an anode or as a cathode. The first electrode 20 can be formed as translucent or transparent. The first electrode 20 includes an electrically conductive material, for example metal and/or a transparent conductive oxide (TCO) or a layer stack of a plurality or layers including metals or TCOs. The first electrode 20 may include for example a layer stack of a combination of a layer of a metal on a layer of a TCO, or vice versa. One example is a silver layer applied on an indium tin oxide (ITO) layer (Ag on ITO) or ITO-Ag-ITO multilayers. By way of example, Ag, Pt, Au, Mg, Al, Ba, In, Ca, Sm or Li, and compounds, combinations or alloys of these materials can be used as metal. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, SnO2, or In2O3, ternary metal-oxygen compounds, such as, for example, AlZnO, Zn2SnO4, CdSnO3, ZnSnO3, MgIn2O4, GaInO3, Zn2In2O5 or In4Sn3O12 or mixtures of different transparent conductive oxides also belong to the group of TCOs.

The first electrode 20 may include, as an alternative or in addition to the materials mentioned: networks composed of metallic nanowires and nanoparticles, for example composed of Ag, networks composed of carbon nanotubes, graphene particles and graphene layers and/or networks composed of semiconducting nanowires. Alternatively or additionally, the first electrode 20 may include or be formed from one of the following structures: a network composed of metallic nanowires, for example composed of Ag, which are combined with conductive polymers, a network composed of carbon nanotubes which are combined with conductive polymers, and/or graphene layers and composites. Furthermore, the first electrode 20 may include electrically conductive polymers or transition metal oxides.

The first electrode 20 can have for example a layer thickness in a range of 10 nm to 500 nm, for example of less than 25 nm to 250 nm, for example of 50 nm to 100 nm.

The first electrode 20 can have a first electrical terminal, to which a first electrical potential can be applied. The first electrical potential can be provided by an energy source (not illustrated), for example by a current source or a voltage source. Alternatively, the first electrical potential can be applied to the carrier 12 and the first electrode 20 can be supplied indirectly via the carrier 12. The first electrical potential can be for example the ground potential or some other predefined reference potential.

The optically functional layer structure 22 can be an organic functional layer structure and/or include a hole injection layer, a hole transport layer, an emitter layer, an electron transport layer and/or an electron injection layer.

The hole injection layer can be formed on or above the first electrode 20. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis (naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene);

DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bisphenylamino)phenyl]-9H-fluorene; N,N'-bis(phenanthren-9-yl)-N,N'-bis(phenyl) benzidine; 2,7-bis[N,N-bis(9,9-spirobifluoren-2-yl)amino)-9,9-spirobifluorene; 2,2'-bis[N,N-bis(biphenyl-4-yl)amino] 9,9-spirobifluorene; 2,2'-bis(N,N-diphenylamino)9,9-spirobifluorene; di-[4-(N,N-di-tolylamino)phenyl] cyclohexane; 2,2',7,7'-tetra(N,N-di-tolyl) aminospirobifluorene; and/or N,N,N',N'-tetranaphthalen-2-yl-benzidine.

The hole injection layer can have a layer thickness in a range from approximately 10 nm to approximately 1000 nm, for example in a range from approximately 30 nm to approximately 300 nm, for example in a range from approximately 50 nm to approximately 200 nm.

The hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)-phenyl]-9H-fluorene; N,N'-bis(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino] 9,9-spirobifluorene; 2,2'-bis(N,N-diphenylamino)9,9-spirobifluorene; di-[4-(N,N-ditolyl-amino)phenyl] cyclohexane; 2,2',7,7'-tetra(N,N-ditolyl) aminospirobifluorene; and N,N,N',N'-tetranaphthalen-2-yl-benzidine.

The hole transport layer can have a layer thickness in a range of approximately 5 nm to approximately 50 nm, for example in a range of approximately 10 nm to approximately 30 nm, for example approximately 20 nm.

The one or a plurality of emitter layers, for example including fluorescent and/or phosphorescent emitters, can be formed on or above the hole transport layer. The emitter layer may include organic polymers, organic oligomers, organic monomers, organic small, non-polymeric molecules ("small molecules") or a combination of these materials. The emitter layer may include or be formed from one or a plurality of the following materials: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)3 (tris(2-phenylpyridine)iridium III), red phosphorescent Ru (dtb-bpy)3*2(PF6) (tris[4,4'-di-tert-butyl-(2,2')-bipyridine] ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited for example by means of a wet-chemical method, such as, for example, a spin coating method.

The emitter materials can be embedded in a suitable manner in a matrix material, for example a technical ceramic or a polymer, for example an epoxy; or a silicone.

The first emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The electron transport layer can be formed, for example deposited, on or above the emitter layer. The electron transport layer may include or be formed from one or a plurality of the following materials: NET-18; 2,2',2''-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)borane; 1-methyl-2-(4-(naphthalen-2-yl)phenyl)-1H-imidazo[4,5-f] [1,10] phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

The electron injection layer can be formed on or above the electron transport layer. The electron injection layer may include or be formed from one or a plurality of the following materials: NDN-26, MgAg, $Cs_2CO_3$, $Cs_3PO_4$, Na, Ca, K, Mg, Cs, Li, LiF; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f] [1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure including two or more organic functional layer structure units, corresponding intermediate layers can be formed between the organic functional layer structure units. The organic functional layer structure units can be formed in each case individually by themselves in accordance with a configuration of the optically functional layer structure 22 explained above. The intermediate layer can be formed as an intermediate electrode. The intermediate electrode can be electrically connected to an external voltage source. The external voltage source can provide a third electrical potential, for example, at the intermediate electrode. However, the intermediate electrode can also have no external electrical terminal, for example by the intermediate electrode having a floating electrical potential.

The organic functional layer structure unit can have for example a layer thickness in a range for example of 10 nm to 3 μm, for example of 50 nm to 1 μm, for example of 100 nm to 300 nm.

The optoelectronic component 10 can optionally include further functional layers, for example arranged on or above the one or the plurality of emitter layers or on or above the electron transport layer. The further functional layers can be for example internal or external coupling-in/coupling-out structures that can further improve the functionality and thus the efficiency of the optoelectronic component 10.

The second electrode 23 can be formed in accordance with one of the configurations of the first electrode 20, wherein the first electrode 20 and the second electrode 23 can be formed identically or differently. The second electrode 23 can be formed as an anode or as a cathode. The second electrode 23 can have a second electrical terminal, to which a second electrical potential can be applied. The second electrical potential can be provided by the same energy source as, or a different energy source than, the first electrical potential. The second electrical potential can be different than the first electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The encapsulation layer 24 can also be designated as thin-film encapsulation. The encapsulation layer 24 can be formed as a translucent or transparent layer. The encapsulation layer 24 forms a barrier against chemical impurities or atmospheric substances, in particular against water (moisture) and oxygen. In other words, the encapsulation layer 24 is formed in such a way that substances that can damage the optoelectronic component, for example water, oxygen or solvent, cannot penetrate through it or at most very small proportions of said substances can penetrate through it. The encapsulation layer 24 can be formed as an individual layer, a layer stack or a layer structure.

The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), Nylon 66, and mixtures and alloys thereof.

The encapsulation layer 24 can have a layer thickness of approximately 0.1 nm (one atomic layer) to approximately 1000 nm, for example a layer thickness of approximately 10 nm to approximately 100 nm, for example approximately 40 nm. The encapsulation layer 24 may include a high refractive index material, for example one or a plurality of material(s) having a high refractive index, for example having a refractive index of at least 2.

If appropriate, the first barrier layer can be formed on the carrier 12 in a manner corresponding to a configuration of the encapsulation layer 24.

The encapsulation layer 24 can be formed for example by means of a suitable deposition method, e.g. by means of an atomic layer deposition (ALD) method e.g. a plasma enhanced atomic layer deposition (PEALD) method or a plasmaless atomic layer deposition (PLALD) method, or by means of a chemical vapor deposition (CVD) method e.g. a plasma enhanced chemical vapor deposition (PECVD) method or a plasmaless chemical vapor deposition (PLCVD) method, or alternatively by means of other suitable deposition methods.

If appropriate, a coupling-in or coupling-out layer can be formed for example as an external film (not illustrated) on the carrier 12 or as an internal coupling-out layer (not illustrated) in the layer cross section of the optoelectronic component 10. The coupling-in/-out layer may include a matrix and scattering centers distributed therein, wherein the average refractive index of the coupling-in/-out layer is greater than the average refractive index of the layer from which the electromagnetic radiation is provided. Furthermore, in addition, one or a plurality of antireflection layers can be formed.

The adhesion medium layer 36 may include adhesive and/or lacquer, for example, by means of which the cover 38 is arranged, for example adhesively bonded, on the encapsulation layer 24, for example. The adhesion medium layer 36 can be formed as transparent or translucent. The adhesion medium layer 36 may include for example particles which scatter electromagnetic radiation, for example light-scattering particles. As a result, the adhesion medium layer 36 can act as a scattering layer and lead to an improvement in the color angle distortion and the coupling-out efficiency.

The light-scattering particles provided can be dielectric scattering particles, for example composed of a metal oxide, for example, silicon oxide ($SiO_2$), zinc oxide (ZnO), zirconium oxide ($ZrO_2$), indium tin oxide (ITO) or indium zinc oxide (IZO), gallium oxide (Ga$_2$O$_x$), aluminum oxide, or titanium oxide. Other particles may also be suitable provided that they have a refractive index that is different than the effective refractive index of the matrix of the adhesion medium layer 36, for example air bubbles, acrylate, or hollow glass beads. Furthermore, by way of example, metallic nanoparticles, metals such as gold, silver, iron nanoparticles, or the like can be provided as light-scattering particles.

The adhesion medium layer 36 can have a layer thickness of greater than 1 μm, for example a layer thickness of a plurality of μm. In various embodiments, the adhesive can be a lamination adhesive.

The adhesion medium layer 36 can have a refractive index that is less than the refractive index of the cover 38. The adhesion medium layer 36 may include for example a low refractive index adhesive such as, for example, an acrylate having a refractive index of approximately 1.3. However, the adhesion medium layer 36 can also include a high refractive index adhesive which for example includes high refractive index, non-scattering particles and has a layer-thickness-averaged refractive index that approximately corresponds to the average refractive index of the organic functional layer structure 22, for example in a range of approximately 1.7 to approximately 2.0.

A so-called getter layer or getter structure, i.e. a laterally structured getter layer, can be arranged (not illustrated) on or above the active region. The getter layer can be formed as translucent, transparent or opaque. The getter layer may include or be formed from a material that absorbs and binds substances that are harmful to the active region. A getter layer may include or be formed from a zeolite derivative, for example. The getter layer can have a layer thickness of greater than approximately 1 μm, for example a layer thickness of a plurality of μm. In various embodiments, the getter layer may include a lamination adhesive or be embedded in the adhesion medium layer 36.

The cover 38 can be formed for example by a glass cover, a metal film or a sealed plastics film cover. The cover 38 can be arranged on the encapsulation layer 24 or the active region for example by means of frit bonding (glass frit bonding/glass soldering/seal glass bonding) by means of a conventional glass solder in the geometrical edge regions of the organic optoelectronic component 10. The cover 38 can have for example a refractive index (for example at a wavelength of 633 nm) of 1.55.

The invention is not restricted to the embodiments specified. By way of example, the optoelectronic component 10 may include more or fewer contact cutouts 42, 44. Furthermore, all the optoelectronic components 10 shown may include more or fewer layers. By way of example, diverse optical functional layers can be formed which for example improve the efficiency of the optoelectronic component 10 or influence the emission behavior of the optoelectronic component 10. By way of example, coupling-out layers, mirror layers, antireflection layers and/or scattering layers can be formed. Furthermore, the plug elements 50, conductor elements 54 or the plug bodies 52 can be different with regard to their shape and number.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
   a carrier body,
   an optoelectronic layer structure formed above the carrier body and having at least one contact region for electrically contacting the optoelectronic layer structure,
   a covering body arranged above the optoelectronic layer structure,
   at least one contact cutout which extends through the carrier body and/or the covering body and in which at least one part of the contact region is exposed,
   at least one plug element which is arranged at least partly in the contact cutout and which tightly closes the contact cutout so that the contact cutout is sealed by the plug element, for electrically contacting the optoelectronic component, and
   a contact medium, which is arranged in the contact cutout and via which the plug element is electrically coupled to the contact region.

2. The optoelectronic component as claimed in claim 1, wherein the optoelectronic layer structure has an encapsulation layer and/or an adhesion medium layer, and wherein the contact cutout extends through the encapsulation layer and/or through the adhesion medium layer.

3. The optoelectronic component as claimed in claim 1, wherein the contact medium is at least partly liquid.

4. The optoelectronic component as claimed in claim 1, wherein the contact medium comprises a conductive adhesive.

5. The optoelectronic component as claimed in claim 1, wherein the contact medium comprises an alloy.

6. The optoelectronic component as claimed in claim 1, wherein the plug element is in direct physical contact with the contact region via a conductor element.

7. The optoelectronic component as claimed in claim 1, wherein the plug element has at least one conductor element via which the electrical coupling to the contact region is formed.

8. The optoelectronic component as claimed in claim 1, wherein the plug element has a plug body, wherein a sealant is arranged between the plug body and the covering body, said sealant contributing to the fact that the contact cutout is tightly closed by means of the plug element.

9. The optoelectronic component as claimed in claim 8, wherein the sealant has an adhesive effect, and wherein the plug body is fixed to the covering body by means of the sealant.

10. The optoelectronic component as claimed in claim 1, further comprising at least two contact cutouts, and wherein the plug element has at least two conductor elements, wherein respectively one conductor element is arranged in the contact cutouts.

11. The optoelectronic component as claimed in claim 1, wherein the plug element has at least one holding element by means of which the optoelectronic component is mechanically fixed.

12. A method for producing an optoelectronic component, the method comprising:
   providing a carrier body,
   forming an optoelectronic layer structure having at least one contact region for electrically contacting the optoelectronic layer structure above the carrier body,
   arranging a covering body above the optoelectronic layer structure, before or after arranging the covering body, forming at least one contact cutout in the carrier body and/or the covering body in such a way that it extends through the carrier body and/or the covering body and that at least one part of the contact region is exposed in it, arranging a contact medium in the contact cutout, for the purpose of electrically contacting the optoelectronic component arranging at least one plug element at least partly in the contact cutout in such a way that it tightly closes the contact cutout, that the contact cutout is sealed by the plug element, and that it is electrically coupled to the contact region via the contact medium.

13. The method as claimed in claim 12, wherein, before arranging the plug element in the contact cutout, a sealant layer is arranged on the plug element and/or on the covering body.

14. The method as claimed in claim 13, wherein the plug element is fixed to the covering body with the aid of the sealant.

15. The method as claimed in claim 12, wherein the contact medium is introduced into the contact cutout in a liquid state.

\* \* \* \* \*